(12) United States Patent
Asplund

(10) Patent No.: US 6,982,650 B1
(45) Date of Patent: Jan. 3, 2006

(54) METHOD, SYSTEM AND APPARATUS FOR REMOTE MEASURING OF ELECTRICAL POWER

(75) Inventor: Johan E. C. Asplund, Stockholm (SE)

(73) Assignee: Iprobe AB, Johanneshov (SE)

( * ) Notice: Subject to any disclaimer, the term of this patent is extended or adjusted under 35 U.S.C. 154(b) by 376 days.

(21) Appl. No.: 10/088,810

(22) PCT Filed: Sep. 22, 2000

(86) PCT No.: PCT/SE00/01843

§ 371 (c)(1),
(2), (4) Date: May 9, 2002

(87) PCT Pub. No.: WO01/22102

PCT Pub. Date: Mar. 29, 2001

(30) Foreign Application Priority Data

Sep. 23, 1999 (SE) .................................. 9903447
Mar. 20, 2000 (SE) .................................. 0000913

(51) Int. Cl.
*G08C 19/00* (2006.01)

(52) U.S. Cl. ............. 340/870.02; 340/566; 324/126; 324/117 R

(58) Field of Classification Search ......... 340/870.02, 340/566, 870.25; 324/126, 107, 142, 117 R
See application file for complete search history.

(56) References Cited

U.S. PATENT DOCUMENTS

| 5,448,222 | A | * | 9/1995 | Harman | 340/566 |
| 5,467,011 | A | * | 11/1995 | Hunt | 324/67 |
| 5,942,816 | A | | 8/1999 | Carter | |
| 6,714,000 | B2 | * | 3/2004 | Staats | 324/126 |

FOREIGN PATENT DOCUMENTS

| EP | 0 528 634 A2 | 2/1993 |
| EP | 0 949 734 A2 | 10/1999 |
| GB | 2301903 A | 12/1996 |
| GB | 2305333 A | 4/1997 |
| GB | 321305 A | 7/1998 |

OTHER PUBLICATIONS

Stymne, P., Kronometern mäter el, värme och vatten, ERA 1-2: 1999, Feb. 1999, pp. 38-39.

* cited by examiner

Primary Examiner—Michael Horabik
Assistant Examiner—Hung Dang
(74) Attorney, Agent, or Firm—Ware, Fressola, Van der Sluys & Adolphson LLP

(57) ABSTRACT

In a method, system and apparatus of measuring electrical power to consumers (16a–d) in a power distribution network (12), an electromagnetic field is sensed around at least one electrical conductor (12) in a power meter (30a–d) located at a consumer. The current flowing through the conductor is then derived from the sensed electromagnetic field. Instantaneous current values are stored in an electronic memory powered by the electromagnetic field. These instantaneous values or values derived from the instantaneous values are transmitted as digital information on the network to a receiver (20) provided at a distance from the power meter.

19 Claims, 3 Drawing Sheets

METHOD, SYSTEM AND APPARATUS FOR REMOTE MEASURING OF ELECTRICAL POWER

FIELD OF INVENTION

The present invention relates generally to a method, a system and an apparatus for measurement of electrical power and more specifically to a method, a system and an apparatus wherein electrical power meters connected to an electrical distribution network are remotely controlled by a remote server.

BACKGROUND

In the field of electrical power measurement, many kinds of electrical power meters are known. However, prior art apparatus have been dimensioned with regard to electromechanical measuring devices. This has led to bulky devices, which are difficult to install.

The UK patent document GB-2 321 305 discloses a remote meter reading apparatus provided for retrofitting to an existing meter. This reading apparatus relies on an already installed meter having a Ferraris disc. The apparatus is provided with a wireless transmitter for transmitting data derived from a sensor to a remote location. However, this solution provides for a bulky device limited to its application in existing networks.

An electronic meter or measuring electrical power fed from an electrical power distribution network to an electrical power consumer itself requires electrical power in order to function. A convenient way of providing this power is to furnish the electronic meter with means for drawing electrical power from the power network used to supply the consumer. However, the current which an electronic meter is permitted to draw from an electrical power distribution network is limited by statutory regulation.

The UK patent document GB-2 301 903 discloses an electrical power supply meter provided with an opto-transmitter arranged for communicating data appertaining to a meter reading and at the same time not to disturb the power network connected to the meter.

Trip units for tripping an electronic circuit are known for example through the European patent document EP 0 949 734-A2. In the device disclosed therein processors are arranged to trip an electric circuit on detection of a fault condition. However, there are other instances where tripping of an electric circuit is desired.

OBJECTS OF THE INVENTION

An object of the present invention is to provide an electrical power consumption measuring system wherein electrical power meters are remotely read and controlled in an efficient way.

Another object is to provide an electrical power meter, which is inexpensive, easy to install and is adapted for communication through the electrical power network to which it is connected.

Another object is to provide a method of remotely controlling an electrical power meter.

SUMMARY OF THE INVENTION

The invention is based on the realization that the electromagnetic field around an electric conductor can be used to measure the power flowing through the conductor by means of sensors without any movable parts and to drive an electronic circuit. This is used together with digital communication through the electric conductor to provide for remote measuring and control of the electrical power consumed by a consumer connected to an electric power network.

The invention provides a measuring system wherein the measuring device can be installed without skilled personnel, i.e., the subscriber caters for the installation.

A method is also provided by means of which it is possible to remotely collect information regarding electrical power consumption of customers in an efficient way.

Another advantage is the possibility to remotely disconnect a subscriber by means of a circuit breaker provided in the sensing apparatus.

BRIEF DESCRIPTION OF DRAWINGS

The invention is now described, by way of example, with reference to the accompanying drawings, in which.

DETAILED DESCRIPTION OF THE INVENTION

Figure 1:
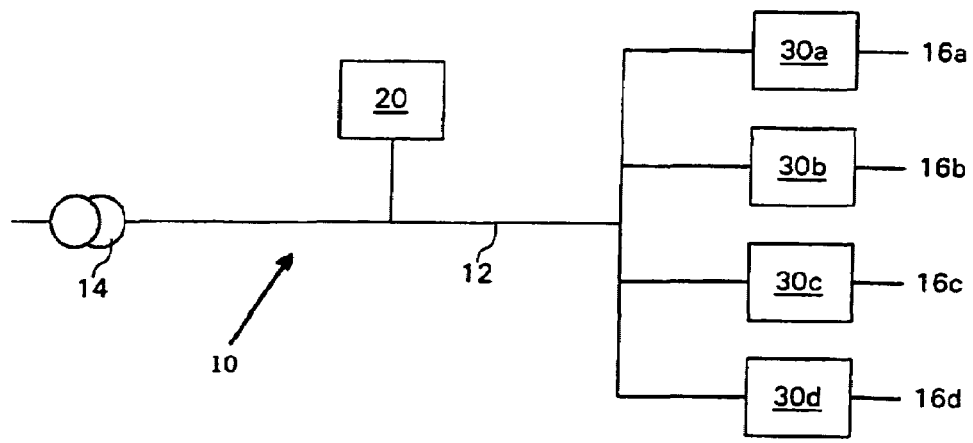
FIG. 1 is an overview of a measuring system according to the invention.

In the following, a detailed description of the invention will be given. Some of the elements described herein are identical to their shape and function and are then given the same reference numeral followed by an accompanying letter. When identical elements are referred to collectively the accompanying letter can be omitted.

Reference is first made to FIG. 1, wherein part of an electrical power network system, generally designated 10, is shown. The system shown in the figure comprises electrical three phase power lines 12 running between a connection point, such as a power station 14, and a number of electrical power consumers 16a–d.

Somewhere close to the connection point there is a host server 20 connected to the power lines 12. The host server 20 is an ordinary computer provided with a power-net modem supporting TCP/IP. The server 20 is running administration software etc. and will be further described below.

Figure 2:
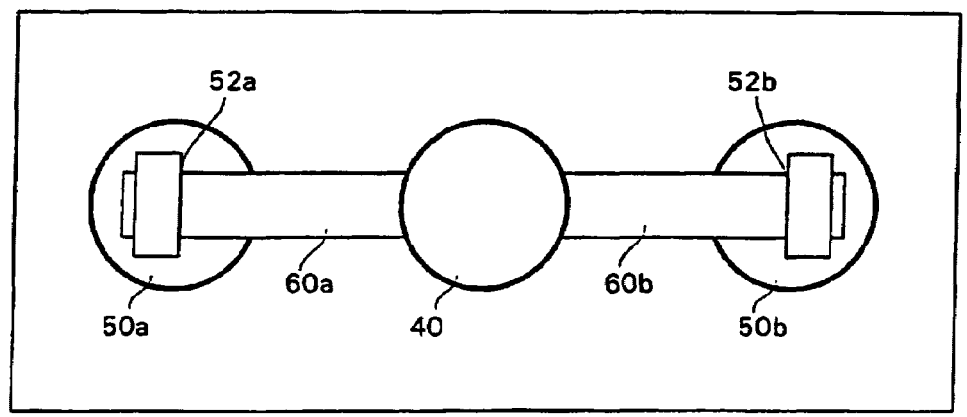
FIG. 2 is a schematic overview of an electrical power meter used in the system shown in FIG. 1

At each consumer there is provided a respective electrical power meter 30a–d, an overview of which will now be given with reference to FIG. 2. The three-phase meter is made up of three parts shaped and configured as conventional fuses or circuit breakers. The three parts comprise two identical slave modules 50a, 50b connected to a master module 40. The three modules are arranged to be mounted as conventional plug fuses in a fuse box with the master module 40 arranged in the center position and the slave modules 50a, 50b arranged on either side thereof. The slave modules are connected to the master module by means of a respective strip 60a, 60b made of polyester or another fragile or brittle material. The reason for this choice of material is that it should be difficult to remove the strip once it is installed, thereby preventing fraudulent manipulation of the arrangement.

The strip 60 is permanently attached to the master module 40 and electrically connected thereto by means of a pattern (not shown) of three rather wide printed copper paths 62 running in parallel between the master module 40 and the slave module 50 when connected thereto. The procedure of connecting the slave modules to the master module follows the following steps. First, the master module 40 and the slave modules 50a, 50b are screwed into a respective socket with the master module 40 positioned between the slave modules 50a, 50b. Special care must be taken to ensure that the strips 60a, 60b are not damaged during this process. The strips 60a, 60b are then inserted into a respective slot 52a, 52b arranged in the slave modules. Once inserted into the slots 52, the strips 60 cannot be withdrawn from the slave modules because of a one-way retaining means provided in the slot.

With the strips 60 attached, it is not possible to unscrew the modules 40, 50 because the strips 60 would then break, destroying the arrangement by breaking the electrical connection between the master module and the slave modules.

When mounted in the fuse box, the modules 40, 50 function as ordinary fuses, normally of the 10 or 16 Amps size.

Figure 3A:
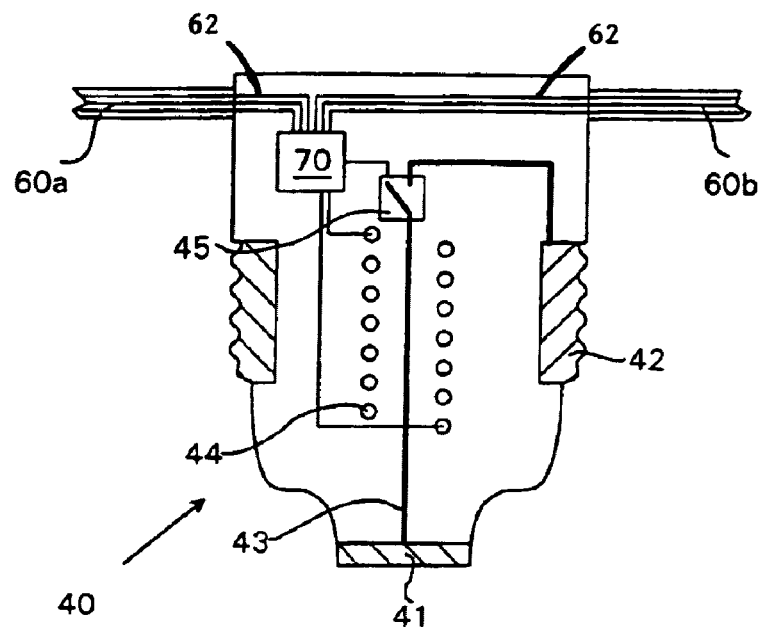
FIGS. 3a and 3b are cross-sectional views of a master and a slave module, respectively, to be incorporated in electrical power meter shown in FIG. 2.

The structure of the master module 40 will now be described with reference to FIG. 3a, which shows a cross-section through the center of the master module. The module has a general outline similar to a conventional fuse, with a bottom connector 41 adapted for connection to the bottom surface of the fuse socket (not shown) and thus functioning as a first connector of the module. The bottom connector 41 is electrically connected to a thread 42 by means of a conductive wire 43. The thread is shaped so as to fit with the internal thread (not shown) provided in the fuse socket and thus functions as a second connector of the module. A major portion of the conductive wire 43 runs essentially parallel to the longitudinal axis of the fuse 40.

With the module 40 mounted in the socket, the wire 43 forms a part of the wire 12 supplying the consumer 16 with electrical power, see FIG. 1. Thus, all power consumed passes through the wire 43.

A coil 44 is provided around a portion of the conductive wire 43, preferably made of copper. The two ends of the coil are connected to inputs of an electronic circuitry 70 provided in the fuse. By means of the coil 44, the electromagnetic field generated by current flowing in the wire 43 is detected. More specifically, the generated field in turn generates a current in the coil 44, which is read and interpreted by the circuitry 70, thus generating instantaneous values of the current flowing in the wire 43. The number of turns of the coil is adapted to the expected induced field so as to give a suitable measuring value. In the preferred embodiment, the number of turns in the coil 44 is about 500, giving an input voltage of about 3 Volts to the circuitry 70. However, too many turns lead to too much metal, giving an inductance that will decrease the maximum practical frequency induced in the coil.

As stated above, the two strips 60a, 60b are fixedly connected to the master module 40. The conductive paths 62 on the strips are connected to respective inputs of the electronic circuitry 70 of the master module 40.

An electronic trip circuit 45 is provided in serial connection with the wire 43. The trip circuit 45 is controlled by the circuitry 70, which thereby can break the current path between the connectors 41 and 42.

All components included in the modules 40 and 50 are preferably embedded in a mold made of a suitable polymer.

Figure 3B:
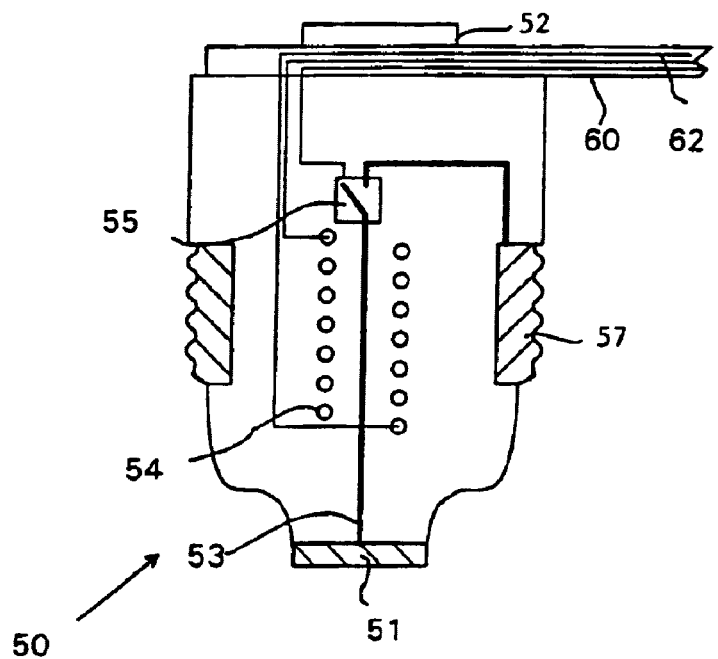

In FIG. 3b, a slave module 50 is shown in cross-section. The slave module is similar to the master module with the exception of the electronic circuitry 70, which is omitted in the slave modules. Thus, a slave module comprises a first connector 51, a second connector 57, a conductive wire 53 there between, a coil 54 and a trip circuit 55. The coil 54 and the trip circuit 55 are connected to a contact means 56 arranged to connect to the conductive paths 62 of a strip 60 inserted into the above mentioned slot 52 of the slave module 50. In that way, both the coil 54 and the trip circuit 55 of a slave module are connected to the electronic circuitry 70 of the master module 40.

Figure 4:
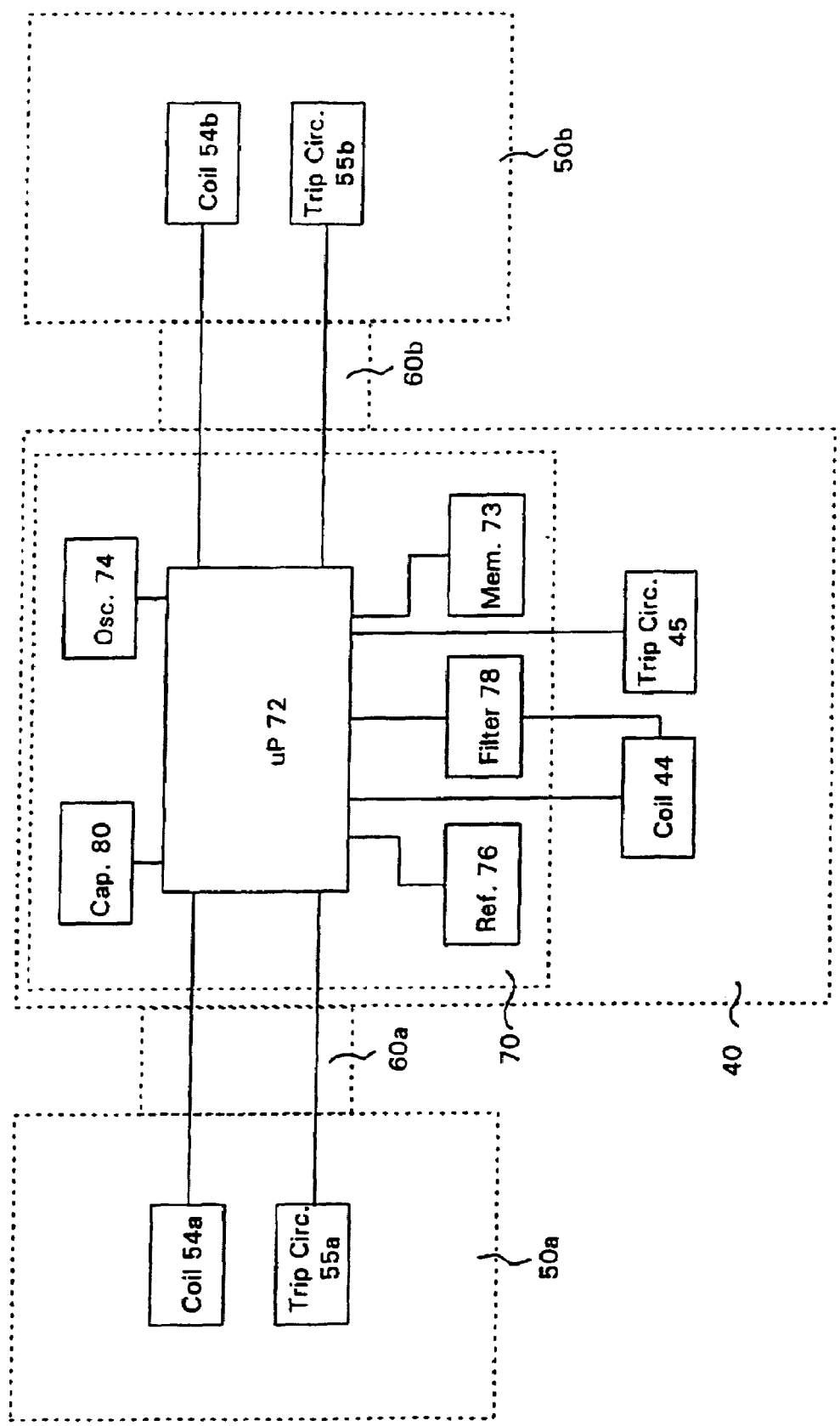
FIG. 4 is a schematic block diagram of the measuring apparatus shown in FIG. 2.

The electronic circuitry 70 of the master module 40 will now be described, partly with reference to FIG. 4, which is a schematic block diagram of the electronic function of the master-slave arrangement shown in FIG. 2. The main part of the circuitry 70 is a processor 72. This is preferably a low voltage version of the type 8751 processor, operating at 2.7 Volts or lower, and provided with an internal EEPROM. The low power consumption of this device, less than 150 mamps, makes this circuit ideal for this kind of application.

An oscillator 74 is provided as a reference clock for the circuitry 70. A preferred frequency of the oscillator is 100 kHz.

There is also provided an internal reference 76. Preferred values for this reference is 1 Volt and 1 Ohm.

Filters 78 functioning as stabilizers are also provided between the coil 44 and processor 72.

Finally, there is provided a capacitor 80 with a preferred value of 40 $\mu$F. The function of this component will be described below.

The function of the measuring system will now be described. As already mentioned, the currents in the wires 12 leading to the consumers 16, see FIG. 1, are detected by means of the coils 44, 54a, 54b provided in the modules 40, 50a, and 50b, respectively. The measuring values are directed to inputs of the microprocessor 72. The actual currents flow ng to the consumer 16 is there derived from the measured values by means of mathematical functions known to the person skilled in the art. Samples of measured values are taken with a frequency of 1000 Hz, i.e., 1000 samples are taken per second. The samples comprise both current and voltage values. This is necessary as the current and voltage in a power line are mutually displaced. Due to this, in order to get a correct power measurement, both current and voltage values are required.

Superposed on the basic electric power frequency in the lines 12, normally 50 or 60 Hz, is a Frequency Shift Keying (FSK) signal on a certain undefined frequency band. This FSK signal is used for communication via one of the power lines 12 between the server 20 and the different electrical power meters 30. In the preferred embodiment, this communication uses the TCP/IP protocol. This protocol is suitable for this kind of application, wherein it sometimes is necessary to retransmit a message several times before it is received successfully.

Each electrical power meter 30, i.e., master module 40, has its own IP address. In the microprocessor 72, there is a software application listening for messages intended for this particular address. Thus, the FSK signal is extracted from the current induced in the coil 44 by means of the filter 78 and is interpreted and if the address given in the header of the message is correct, the rest of the message is also interpreted. Simultaneously, measuring values are taken and stored in the memory 73.

Two different types of measuring values are stored: an instantaneous value stored as a 16-bit value and a cumulative value stored as a 64-bit value. The cumulative value is effectively an odometer keeping track of the total consumed power. This value can be used for billing purposes, as will be described below.

The communication between the server 20 and the master modules 40 follows any suitable command structure adapted to this application. Thus, there are commands for the various tasks for the master modules 40. An example thereof is the GET_ACCOUNT command. The server 20 sends this command together with an IP address for the electrical power meter 30 to be read. When the meter 30 in question reads the command, it retrieves the cumulative value from the memory 73 and sends it together with its IP address onto the power lines 12. This message is then read by the server, which uses the value as a basis for billing.

The master module 40 is also used for transmitting data to the server 20. However, the energy received from the power supply is not sufficient for superposing a FSK signal on the lines 12. Therefore, the capacitor 80 is provided for storing the energy needed for transmitting the FSK signal. In the preferred embodiment, the capacitor has a value of about 40 $\mu F$, giving a voltage of 10 Volts for 400 $\mu s$. Thus, the microprocessor 72 buffers the message in a high voltage buffer and then transmits the signal.

An application implemented in the master module 40 is the remote trip function. In the case a particular consumer is to be excluded from the power network, e.g. due to failing to pay an earlier invoice, the fuses of the electrical power meter 30 can be tripped from the server 20. This is carried out in the following way. A message is sent to the master module 40 belonging to the electrical power meter 30 to be tripped, telling it to open the trip circuits 45. The electronic circuitry then issues a command to the trio circuits 45, 55a, 55b to open, thereby cutting the current path through the modules.

In case the connection between the master module 40 and at least one of the slave modules is broken, this is detected by the microprocessor 70 because there is no current flowing through the loop comprising the slave coils 54. It that case, a message is sent to the server 20, telling that the electrical power meter has failed.

It is also possible to calibrate the master module 40 by means of a predetermined FSK pattern superposed on the normal current of the wires 12. As an example, a signal comprising solely "1":s is transmitted from the server 20. This signal represents a certain current level, which is then detected and interpreted by the master module 40. By means of this detected current shift, the module 40 can then be self-calibrated. Thus, a signal having a predetermined level is input and the output level is determined. The module then calibrates until the output level is equal to the input level. With the described system, billing of the customers is effected in the following way. The server 20 collects and compiles the odometer readings from the meters 30. A software application then connects a number of measurements from a certain device to a predefined tariff and adds information of the account customer 16. This gives the full information to create a record and, hence, a bill to be sent to the customer in any convenient way, such as through the Internet or by ordinary mail.

As the invoice contains all information about the customer and the content of the invoice to be paid, in an electronic format, it is very well suited to be sent directly to a billing service. The billing service lets the customer view the account and the bill over the Internet and also lets him/her select a convenient way to settle it.

The billing and payment service may let the customer get access to the status of the bill and the ways to pay it over the Internet, possibly by means of a so-called Set Top Box (STB). With a STB or other device provided with a smart-card interface, it is possible to view the reception and the status of the electricity consumption on the display of a SWATSCard®. This complete package will make the need for any mailings to the customer obsolete. It also gives the provider of electrical power the possibility to have a diversified tariff, for example on a daily or hourly basis.

A preferred embodiment of the invention has been described. However, the person skilled in the art realizes that this can be varied within the scope of the appended claims without departing from the inventive idea. Thus, an electrical three-phase system has been shown. It is realized that the invention is applicable to single phase systems as well, in which case the slave modules are omitted.

Furthermore, the connection between master and slave modules has been shown in the form of strips fixedly attached to the master module. However, any kind of connecting means is possible as long as it is impossible to remove it once attached. Thus, in an alternative embodiment, the strips 60 are separate parts, being inserted into a slot in both the master and the slave module to be interconnected. Alternatively, the strips 60 are fixedly attached to the slave modules instead.

Although frequency shift keying has been described as the preferred communication method, other communication methods are also possible, such as Phase Shift Keying (PSK).

The electrical power meter has been described as having no display. From a technical point of view, this is entirely feasible. However, in order to comply with regulations and also for the sake of convenience, the master module 40 may comprise a display means, such as a LCD, on which stored current values are displayed.

Although current has been described above as the measured quantity, also voltage is measured in order to calculate the electrical power.

The coils 44, 54 have been described as connected by their respective end portions to the circuitry 70. However, also a portion essentially at the middle of the coils can be connected to the circuitry 70. In that way, more signals are obtained for subsequent interpretation.

What is claimed is:

1. A method of measuring electrical power conducted through at least one electrical conductor, comprising the following steps:
    sensing an electromagnetic field around said at least one electrical conductor at a measuring position, wherein said sensing is effected by means of an electrically conductive coil arranged around said at least one electrical conductor,
    deriving current flowing through said at least one electrical conductor from said sensed electromagnetic field,
    storing instantaneous values for said current in an electronic memory means powered by said electromagnetic field, and
    transmitting digital information on said at least one electrical conductor to a transceiver provided at a distance from said measuring position, said digital information being representative of said instantaneous values.

2. A method according to claim 1, wherein said transmitting is effected by means of frequency shift keying.

3. A method according to claim 1, wherein said electrically conductive coil is wound around said at least one electrical conductor.

4. An electrical power meter connectable to at least one electrical conductor, said power meter comprising:
- means for sensing an electromagnetic field around said at least one electrical conductor, wherein said means for sensing comprises an electrically conductive coil arranged around said at least one electrical conductor,
- means for deriving current flowing through said at least one electrical conductor from said sensed electromagnetic field,
- means for storing instantaneous values for said current, wherein said means for storing are powered by said electromagnetic field, and
- means for transmitting digital information on said at least one electrical conductor to a transceiver provided at a distance from said measuring position, said digital information being representative of said instantaneous values.

5. A meter according to claim 4, comprising:
- at least one first connector connectable to said at least one electrical conductor,
- at least one second connector connectable to an electric load, and
- a switch arranged to interconnect said at least one first and second connectors in normal operation and, when commanded, to disconnect said at least one first connector from said at least one second connector.

6. A meter according to claim 5, wherein said switch means is commanded by a processor.

7. A meter according to claim 6, wherein said processor is commanded by said transceiver via said at least one electrical conductor.

8. A meter according to claim 4, comprising at least one module arranged to be installed as a fuse.

9. A meter according to claim 4, wherein said meter is arranged for measuring three-phase power, comprising:
- a first module including:
- a first connector connectable to said at least one electrical conductor, and
- a second connector connectable to an electric load and to said first connector, and
- two second modules, each of said second modules including:
- a first connector connectable to said at least one electrical conductor, and
- a second connector connectable to an electric load and to said first connector,
- wherein each of said second modules is electrically connectable to said first module by interconnecting means arranged to be permanently attached to said first and second modules.

10. A meter according to claim 9, wherein said interconnecting means comprises a strip made of fragile material, said strip having a layer of electrically conducting paths thereon.

11. A meter according to claim 10, wherein said fragile material is polyester.

12. A meter according to claim 4, wherein said interconnecting means are inserted into slots when permanently attached.

13. A meter according to claim 4, wherein said means for transmitting digital information comprises:
- a processor, and
- a coil arranged around said at least one electrical conductor, the ends of said coil being connected to said processor,
- wherein an electric current commanded by said processor is induced in said coil, resulting in a corresponding induced current in said electrical conductor, by which induced current digital information is transferred via said electrical conductor.

14. A meter according to claim 13, wherein the number of turns of said coil is about 500.

15. A meter according to claim 4, wherein said digital information is transmitted by means of frequency shift keying.

16. A meter according to claim 4, wherein the current flowing through said at least one electrical conductor is measured at a rate of 1000 samples per second.

17. A meter according to claim 4, wherein said electrically conductive coil is wound around said at least one electrical conductor.

18. A system for measuring electrical power, comprising:
(a) an electrical power network,
(b) a computer connected to said power network, and
(c) an electrical power meter connected to said electrical power network, said electrical power network comprising:
- means for sensing an electromagnetic field around said at least one electrical conductor, wherein said means for sensing comprises an electrically conductive coil arranged around said at least one electrical conductor,
- means for deriving current flowing through said at least one electrical conductor from said sensed electromagnetic field,
- means for storing instantaneous values for said current, wherein said means for storing are powered by said electromagnetic field, and
- means for transmitting digital information on said at least one electrical conductor to a transceiver provided at a distance from said measuring position, said digital information being representative of said instantaneous values.

19. A system according to claim 18, wherein said electrically conductive coil is wound around said at least one electrical conductor.

* * * * *

UNITED STATES PATENT AND TRADEMARK OFFICE
CERTIFICATE OF CORRECTION

PATENT NO. : 6,982,650 B1
DATED : January 3, 2006
INVENTOR(S) : Johan Asplund

It is certified that error appears in the above-identified patent and that said Letters Patent is hereby corrected as shown below:

Column 4,
Line 17, "mamps" should be -- µamps --; and
Line 37, "flow ng" should be -- flowing --.

Column 8,
Line 3, "4" should be -- 9 --.

Signed and Sealed this

Thirtieth Day of May, 2006

JON W. DUDAS
*Director of the United States Patent and Trademark Office*